United States Patent
Peng

(10) Patent No.: US 7,004,054 B2
(45) Date of Patent: Feb. 28, 2006

(54) IN-PROCESS TAPE BUR MONITORING

(75) Inventor: Neo Chee Peng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 319 days.

(21) Appl. No.: 09/805,111

(22) Filed: Mar. 14, 2001

(65) Prior Publication Data

US 2002/0083810 A1    Jul. 4, 2002

(30) Foreign Application Priority Data

Dec. 19, 2000    (SG) .............................. 200007526-7

(51) Int. Cl.
*B26D 5/00*    (2006.01)
*B26D 7/06*    (2006.01)

(52) U.S. Cl. .................... 83/61; 83/73; 83/75; 83/76.8; 83/371; 83/922; 156/64; 156/267; 156/353; 451/6; 451/41

(58) Field of Classification Search .................... 83/13, 83/23, 27, 28, 34, 36, 61, 73, 75, 76.7, 78, 83/365, 401, 523, 663, 922, 929.1, 74, 367; 156/253, 267, 353, 522, 64, 250; 451/6, 451/41, 63, 28, 285, 287, 288, 413, 403, 451/8, 9; 29/25, 1

See application file for complete search history.

(56) References Cited

U.S. PATENT DOCUMENTS

| 3,909,915 | A | * | 10/1975 | Phillips | ....................... 228/160 |
| 5,391,923 | A | * | 2/1995 | Harada | ....................... 257/787 |
| 5,422,163 | A | * | 6/1995 | Kamiyama et al. | .......... 428/156 |
| 6,080,263 | A | | 6/2000 | Saito et al. | |
| 6,116,988 | A | | 9/2000 | Ball | |
| 6,258,198 | B1 | * | 7/2001 | Saito et al. | .................. 156/229 |
| 6,845,695 | B1 | * | 1/2005 | Peng | ............................. 83/23 |

FOREIGN PATENT DOCUMENTS

| DE | 10028062 A1 | 3/2001 | |
| EP | 307509 B | 6/1992 | |
| JP | 63-255927 | * 10/1988 | .................. 29/827 |
| JP | 6-310480 A | 11/1994 | |
| JP | 10-209251 A | 8/1998 | |
| JP | 2000353682 | 12/2000 | |

* cited by examiner

*Primary Examiner*—Boyer D. Ashley
(74) *Attorney, Agent, or Firm*—Dickstein Shapiro Morin & Oshinsky LLP

(57) ABSTRACT

The protective tape applied to the front surface of a semiconductor wafer to protect the wafer during backgrinding must be trimmed so that excess tape, known as tape bur, does not extend beyond the perimeter of the wafer. Tape bur may interfere with backgrinding by causing improper grinding, which may lead to wafer breakage. The tape cutter that trims the protective tape to eliminate tape bur is provided with a sensor which detects whether tape bur has been trimmed from the wafer. If tape bur has not been removed from the wafer, corrective action is taken to prevent the wafer from being backgrinded.

5 Claims, 7 Drawing Sheets

IN-PROCESS TAPE BUR MONITORING

FIELD OF THE INVENTION

The present invention relates generally to backgrinding semiconductor wafers, and more particularly to preventing excess tape bur from damaging the wafer during backgrinding.

BACKGROUND OF THE INVENTION

An exemplary semiconductor wafer 100 is shown in FIG. 1A. The wafer 100 is formed by slicing a thin circular disk from a purified block of silicon. The wafer 100 may have a thickness ranging from 500 to 1000 microns. A typical wafer 100 may have a thickness of approximately 740 microns. An integrated circuit fabrication process may be used to form a plurality of semiconductor dies 101 upon the wafer 100. FIG. 1B is a cross sectional view of the wafer 100 and shows that the dies 101 are located near the front surface 103 of the wafer. After the dies 101 have been formed, a sawing process is typically used to separate the dies 101 from the wafer 100. Since the dies 101 are separated portions of the wafer 100, the dies 101 have the same thickness as the wafer 100 (e.g., 740 microns).

Each die 101 may be mounted within a package 150 to form a semiconductor chip 200, as shown in FIG. 2. The package 150, which is designed to protect the die 101 and to coupled a plurality of leads 125 to the die 101, is only compatible with dies 101 having a specified range of thickness. For example, a commercial die package may be designed to accommodate dies having a thickness of approximately 305 microns. It is often desirable to reduce the thickness of the semiconductor package. One method of reducing the thickness of a package is to use a thinner package, which often requires the use of thinner dies 101. For example, some packages may only be compatible with significantly thinner (e.g., 100 micron thick) dies 101. Thus, both conventional and thin profile packages often require dies 101 which are much thinner than most wafers 100.

The procedure to reduce the thickness of the dies 101 so that they are compatible with a given package design is known as backgrinding. This procedure takes advantage of the fact that the dies 101 are formed near the front surface 103 of the wafer. Thus, the back surface 104 of the wafer may be ground down to reduce the thickness of the wafer 100, and the dies 101 formed thereon, if the mechanical stress associated with backgrinding can be controlled to avoid fracturing the wafer 100 or damaging the dies 101. FIG. 3 is a block diagram of a backgrinder 402, which includes a chucktable 300 and grinding wheel 310. The chucktable 300 is used to flatly support the wafer 100 as it is backgrinded by the grinding wheel 310. The flat support offered by the chucltable 300 distributes stress induced by the grinding wheel 310, thereby reducing the chance of wafer fracture. Additionally, referring also to FIG. 5, a layer of protective tape 320 is attached to the front surface 103 of the wafer 100 by a tape applicator 400. Thus, the layer of protective tape 320 lies between the front surface 103 of the wafer 100 and the chucktable 300, thereby protecting the dies 101 and further absorbing mechanical stress.

However, as illustrated by FIG. 4, when excess tape 325 extends significantly beyond the perimeter of the wafer 100, that excess tape 325, also known as tape bur 325, may become trapped and folded between the chucktable 300 and the wafer 100. The tape bur 325 can prevent the chucktable 300 from flatly supporting the wafer 100, and increase the possibility of uneven back side grinding and possible wafer fracture.

In order to minimize this problem, the wafers 100 are processed by a tape cutter 401 before they are backgrinded. The tape cutter 401 is responsible for trimming the protective tape 320 at or near the perimeter of the wafer 100, thereby removing any tape bur 325. However, the tape cutter 401 cannot consistently guarantee that each processed wafer 100 is free of tape bur 325 because the tape cutter 401 is susceptible to several malfunctions. Thus, under certain circumstances, a tape cutter 401 may output a wafer 100 with tape bur 325 for subsequent processing by the backgrinder 402. Accordingly, there is a need for an apparatus and a method to prevent a tape cutter from outputting a wafer with tape bur for subsequent processing by a backgrinder.

SUMMARY OF THE INVENTION

The present invention is directed at a method and apparatus for preventing wafer breakage, caused the presence of a tape bur, during a wafer thinning process. In the present invention, a sensor is added to the tape cutting unit. The sensor enables the tape cutting unit to detect whether the protective tape has been properly trimmed. If the sensor concludes that the protective tape has not been properly trimmed, the tape cutter unit can take corrective action to prevent a wafer having the improperly trimmed tape from being processed by the backgrinder. For example, the sensor can trigger a circuit which halts the tape cutter. Alternatively, the circuit can cause the tape cutter to route the improperly trimmed wafer to an alternate area, where it can be examined by a technician or reprocessed.

BRIEF DESCRIPTION OF THE DRAWINGS

The forgoing and other advantages and features of the invention will be more clearly understood from the following detailed description of the invention which is provided in connection with the accompanying drawings.

DETAILED DESCRIPTION OF THE INVENTION

Figure 1A:
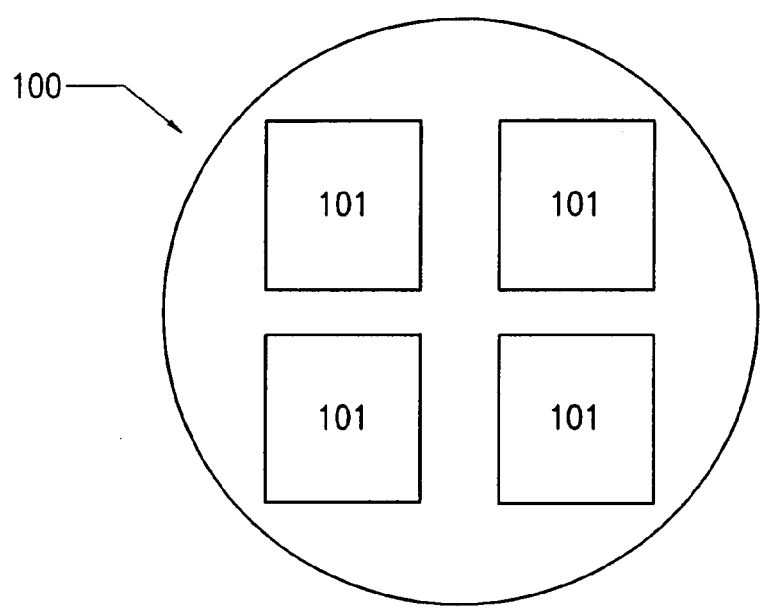
FIG. 1A is a top view of a semiconductor wafer containing a plurality of dies.
Figure 1B:
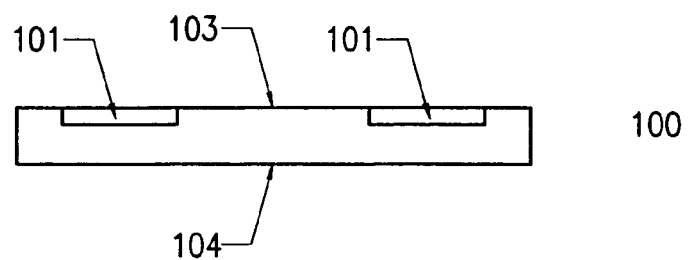
FIG. 1B is a cross sectional view of the semiconductor wafer illustrated in FIG. 1A.
Figure 2:
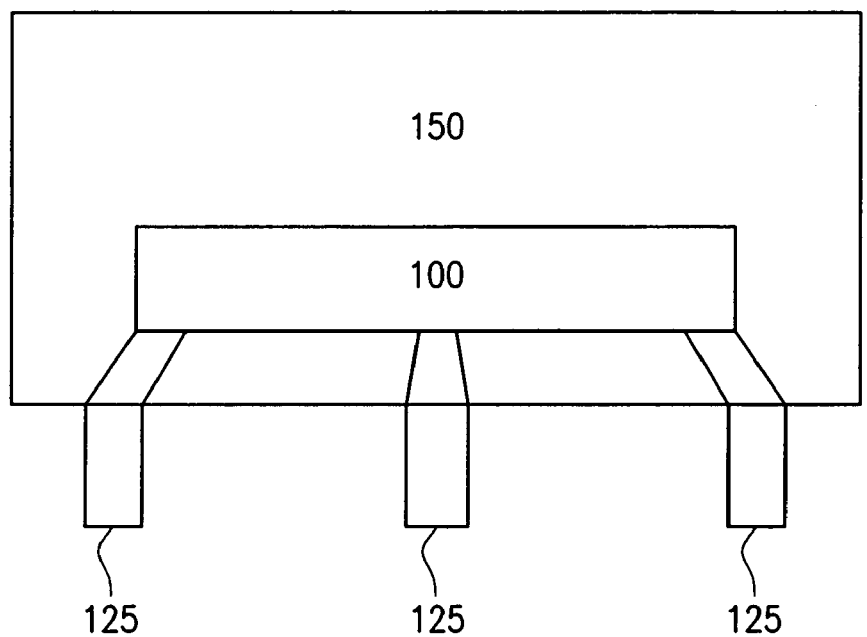
FIG. 2 illustrates a semiconductor die and package.
Figure 3:
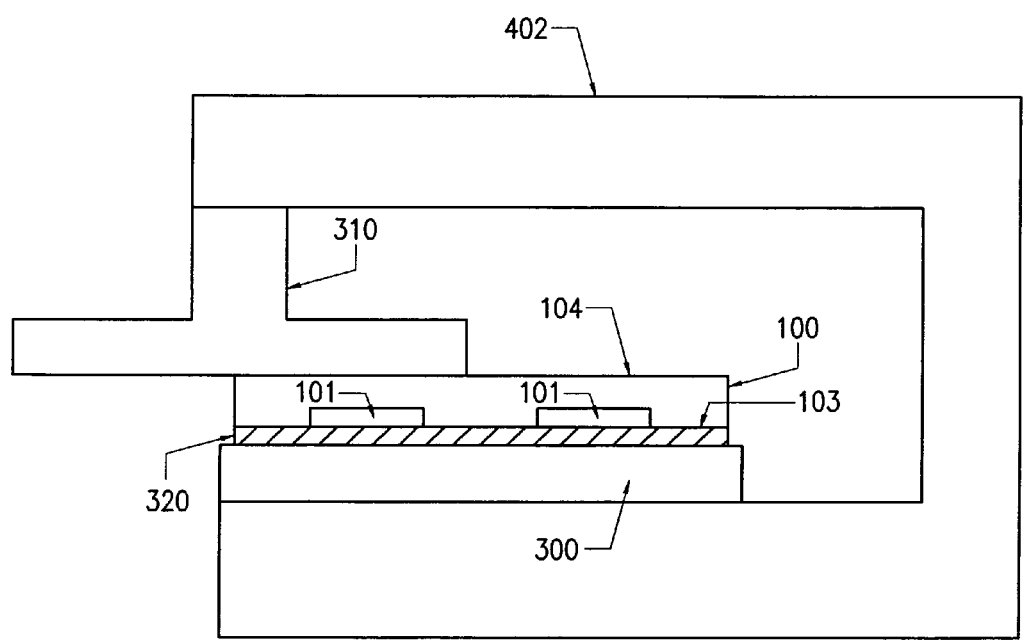
FIG. 3 illustrates a backgrinder containing a wafer having a layer of protective tape attached to its front surface supported by a backgrinder chucktable.
Figure 4:
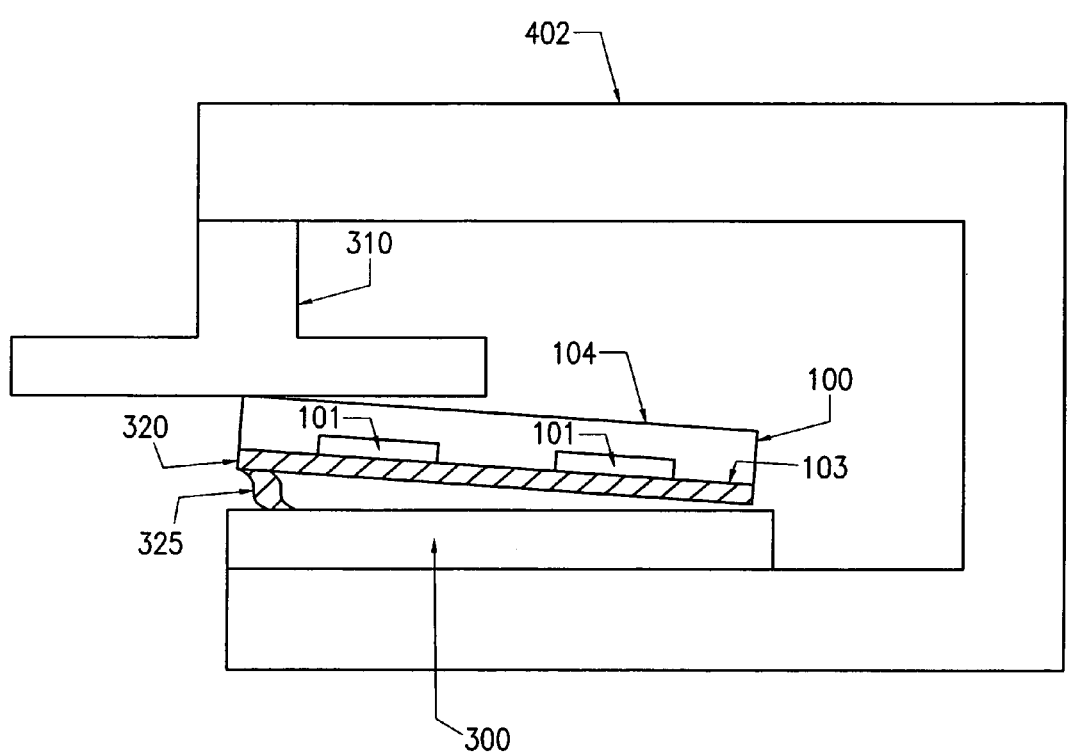
FIG. 4 illustrates how tape bur can prevent the chucktable of a backgrinder from flatly supporting a wafer.
Figure 5:
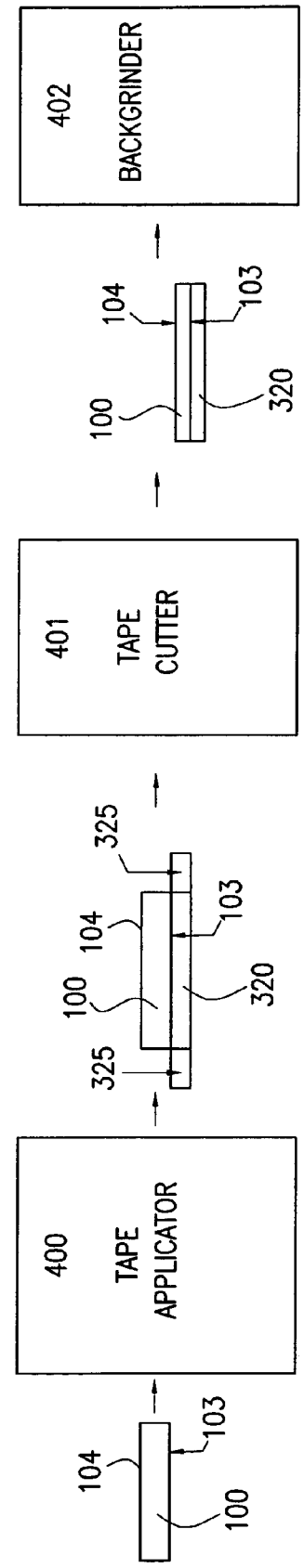
FIG. 5 is a block diagram of a system used for backgrinding.

Now referring to the drawings, where like reference numerals designate like elements, there is shown in FIG. 5 a block diagram of a system for backgrinding wafers. A wafer 100 is processed by a tape applicator 400, which attaches a protective tape 320 to the front surface 103 of the wafer 100. Excess tape surrounding the wafer, known as tape bur 325, is trimmed at or near the perimeter of the wafer 100 by a tape cutter 401. The wafer 100 is subsequently processed by the backgrinder 402, which grinds the back surface 104 of the wafer 100 until the wafer 100 has been ground down to the desired thickness. Although FIG. 5 illustrates the tape applicator 400, the tape cutter 401, and the backgrinder 402 as separate devices, it should be appreciated these devices 400–402 may be partially or fully integrated into a lesser number of devices. For example, the tape applicator 400 may be combined with the tape cutter 401, or the tape cutter 401 may be integrated with the backgrinder 402.

Figure 6A:
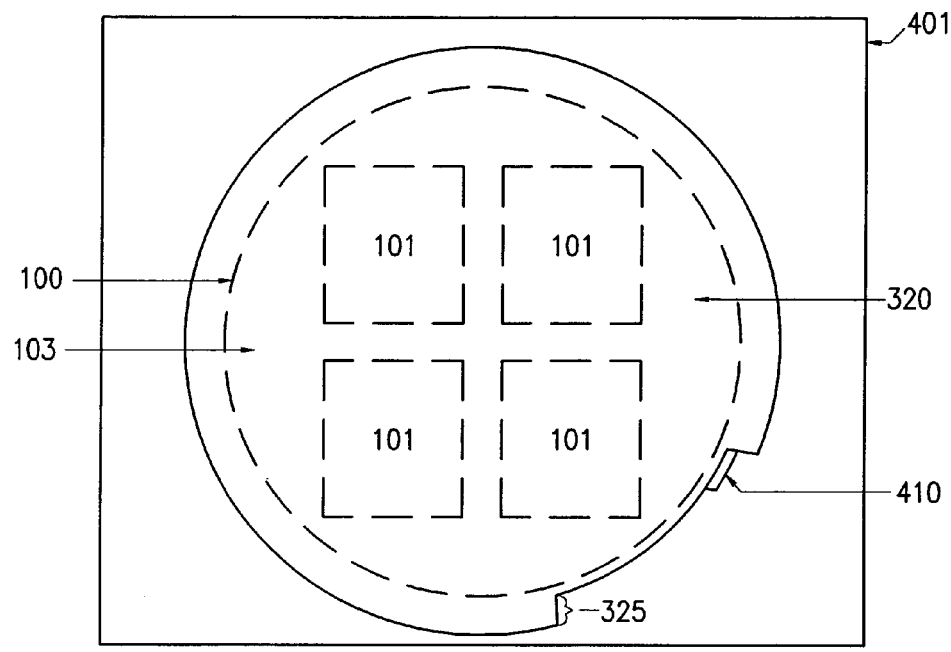
FIGS. 6A and 6B are illustrations of a portion of a prior art tape cutting unit.
Figure 6B:
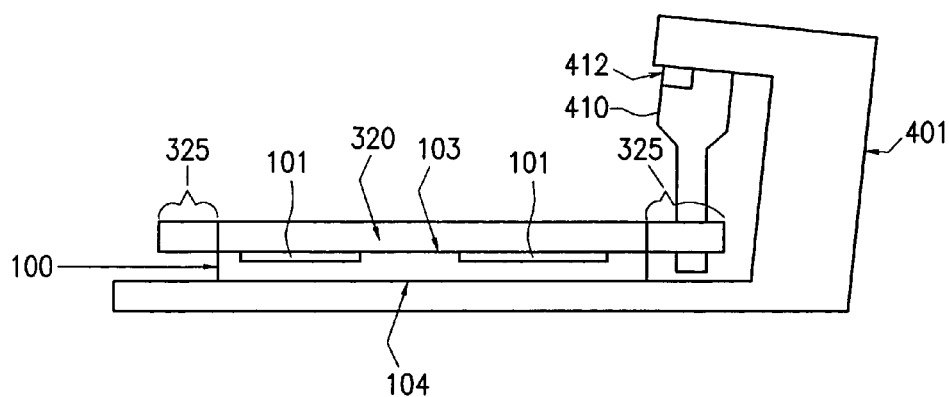

FIGS. 6A and 6B are more detailed diagrams of a prior art tape cutter 401. FIG. 6A is a top view while FIG. 6B is a side view. The tape cutter 401 accepts a wafer 100 including a layer of protective tape 320 applied to the front surface 103 of the wafer 100. The tape cutter 401 includes a cutting element 410 and an overload sensor 412. The cutting element may be any tool capable of cutting the protective tape 320. For example, the cutting element 410 could be a heater blade. The cutting element 410 is positioned at or a predetermined short distance beyond the perimeter of the wafer 100 and may be rotated about the wafer 100 in order to remove tape bur 325. Alternatively, the cutting element 410 may be stationary while the wafer 100 is rotated. The overload sensor 412 measures the stress encountered by the cutting element 410 and is designed to shut off or otherwise disengage the cutting element 410 if unusual stress is encountered. After the wafer 100 has been processed by the tape cutter 410, the wafer 100 is made available to the backgrinder 402.

Unfortunately, the tape cutter 401 is incapable of consistently supplying wafers 100 to the backgrinder 402 which are free of tape bur 325. A wafer 100 which has been processed by the tape cutter 401 may have tape bur 325 due to a several reasons. For example, the cutting element 410 may malfunction and fail to cut the tape 320. Alternatively, the cutting element 410 may not be aligned properly and might not cut the tape 320 at the proper location. Unusual stress may have been measured by the overload sensor 412 thereby causing the cutting element to be turned off or disengaged. Since the tape cutter 401 always outputs its processed wafers 100 to the backgrinder 402, there is a possibility that a wafer 100 with tape bur 325 may be given to the backgrinder 402.

Figure 7A:
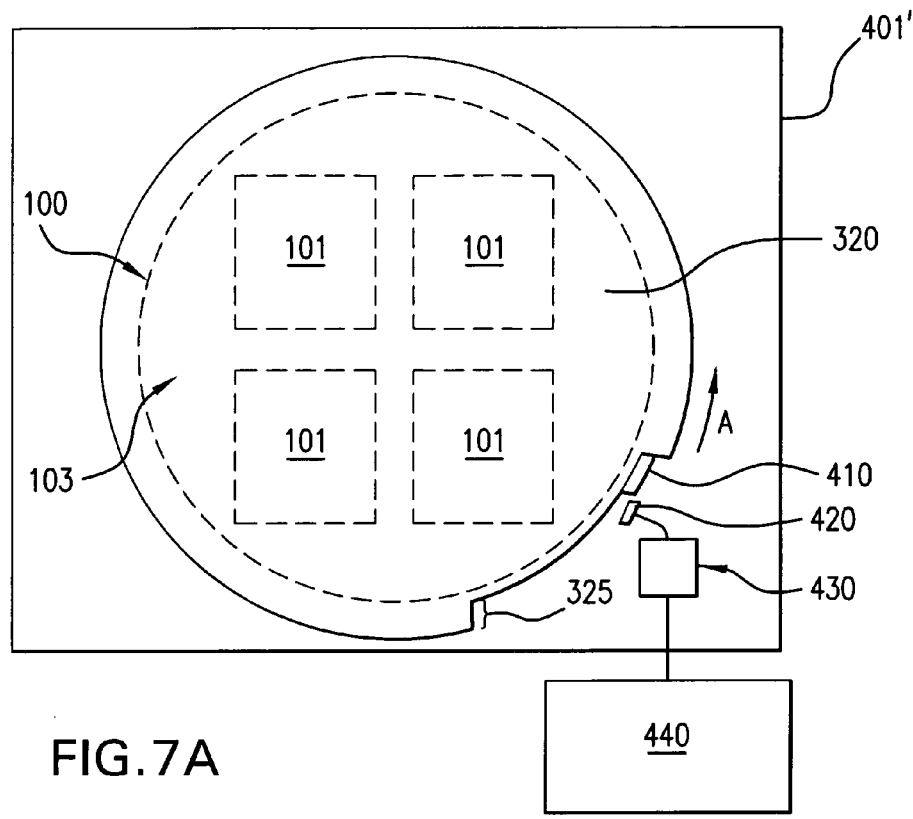
FIGS. 7A and 7B are illustrations of a portion of a tape cutting unit in accordance with the present invention.
Figure 7B:
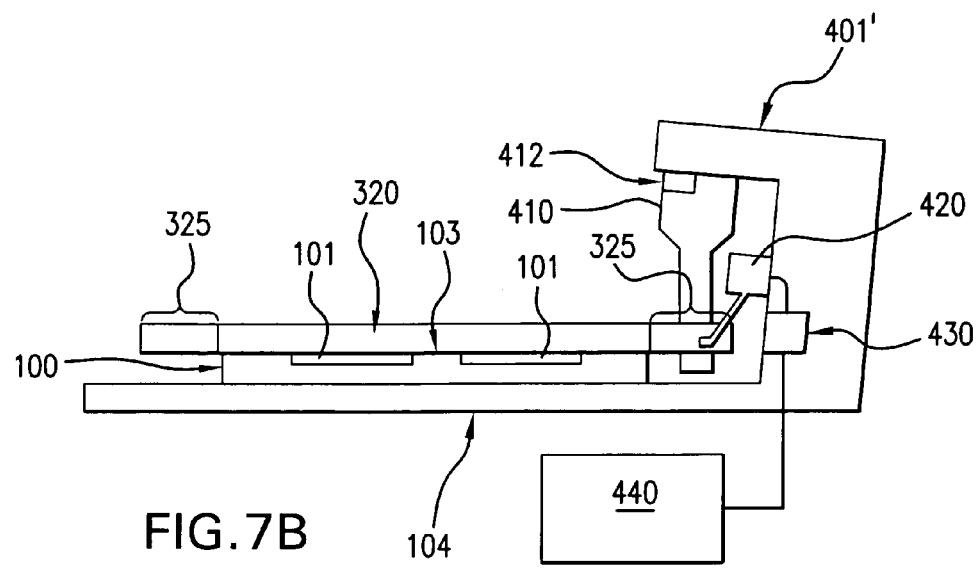

The tape cutter 401' according to the present invention is shown in FIG. 7A (top view) and 7B (side view). The tape cutter 401' is similar to the prior art tape cutter 401, but includes a sensor 420 which is coupled to a circuit 430. In the exemplary embodiment, the sensor 420 is a mechanical sensor which is placed behind the cutting element 410 relative to the direction A of cutting at a predetermined short distance (e.g., 0.5 mm) from the perimeter of the wafer 100. The short distance is chosen based on how much tape can protrude from the perimeter of the wafer 100 without increasing the risk of improper wafer backgrinding due to a tape bur. Thus, the sensor 420 may be placed at varying distances from the perimeter based upon, for example, the thickness or the stiffness of the protective tape 320. Alternatively, the sensor 420 may be any other type of sensor capable of differentiating between the presence and absence of the protective tape. For example, the sensor could be an optical sensor.

The sensor 420, which is coupled to a circuit 430 and which is provided behind the cutting element 410 relative to the direction A of cutting, is used to determine whether the cutting element 410 properly and completely removed the tape bur 325 during a tape cutting operation. If the sensor 420 detects a tape bur 325 after the cutting operation, the circuit 430 causes the tape cutter 401' to take corrective action. The corrective action can be any action which prevents the wafer 100 with tape bur 325 from being processed by the backgrinder 402. In the exemplary embodiment, the circuit 430 halts the tape cutter 401' and prevents automated movement of the wafer 100 to the backgrinder 402 by transport mechanism 440. Alternatively, the tape cutter 401' could be triggered by sensor 420 and associated circuit 430 to have transport mechanism 440 route improperly trimmed wafers 100 to an alternate location (e.g., a reprocessing area). It is also possible to stop operation of the backgrinder 402 by a signal from circuit 430 when the backgrinder 402 receives a wafer containing a tape bur 325.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A cutting apparatus comprising:
   a support for holding a wafer having a protective tape thereon;
   a cutting element placed at a first predetermined distance from said support for moving relative to said support to cut a portion of the protective tape from the wafer when the wafer is placed on the support;
   a sensor comprising a means for detecting if the portion of the protective tape on a wafer is removed by said cutting element, said sensor being positioned behind said cutting element relative to said first predetermined distance from the perimeter of said wafer and relative to said protective tape to perform the detecting;
   a transport mechanism capable of moving the wafer from the support to a grinding apparatus if the portion of the protective tape on the wafer is properly removed; and
   a circuit comprising a means for initiating corrective action to stop the transport mechanism from moving the wafer to the grinding apparatus when the sensor detects that the protective tape is not removed from a wafer by said cutting element, wherein said sensor is coupled to said circuit.

2. The apparatus of claim 1, wherein the circuit for initiating corrective action stops operation of said cutting apparatus.

3. The apparatus of claim 1, wherein the circuit for initiating corrective action prevents a backgrinding apparatus from grinding the wafer.

4. The apparatus of claim 1, wherein said detector comprises a mechanical element for detecting said tape.

5. The apparatus of claim 1, wherein said first predetermined distance is approximately 0.5 mm from the edge of the wafer when the wafer is placed on said support.

* * * * *

UNITED STATES PATENT AND TRADEMARK OFFICE
CERTIFICATE OF CORRECTION

PATENT NO. : 7,004,054 B2
DATED : February 28, 2006
INVENTOR(S) : Neo C. Peng

It is certified that error appears in the above-identified patent and that said Letters Patent is hereby corrected as shown below:

Column 1,
Line 30, "coupled" should read -- couple --;
Line 55, "chucltable" should read -- chucktable --;

Column 2,
Line 22, "caused the" should read -- caused by the --; and

Column 3,
Line 36, "to a several" should read -- to several --.

Signed and Sealed this

Sixth Day of June, 2006

JON W. DUDAS
*Director of the United States Patent and Trademark Office*